United States Patent [19]

Mallick

[11] Patent Number: 5,187,436
[45] Date of Patent: Feb. 16, 1993

[54] NOISE CANCELLATION METHOD IN A BIOMAGNETIC MEASUREMENT SYSTEM USING AN EXTRAPOLATED REFERENCE MEASUREMENT

[75] Inventor: John A. Mallick, Scotia, N.Y.

[73] Assignee: General Electric Company, Schenectady, N.Y.

[21] Appl. No.: 850,725

[22] Filed: Mar. 13, 1992

[51] Int. Cl.$^5$ .................. G01R 33/02; G01N 27/72
[52] U.S. Cl. .................................. 324/244; 324/225
[58] Field of Search ............... 324/244, 247, 248, 225; 128/653.1

[56] References Cited

U.S. PATENT DOCUMENTS 4,386,318  5/1983  Burbank et al. .................. 324/244

Primary Examiner—Walter E. Snow
Attorney, Agent, or Firm—Gene Blomarcich; Paul R. Webb, II

[57] ABSTRACT

A system and method for noiseless measurement of a biomagnetic field uses magnetic field magnitude and gradient measurement at a reference point together with mathematical extrapolation techniques to provide an effectively infinite order gradiometer response from a lower order physical gradiometer. Such a system has the advantages of potentially lower cost, higher accuracy, and easier adjustment and balancing.

4 Claims, 2 Drawing Sheets

NOISE CANCELLATION METHOD IN A BIOMAGNETIC MEASUREMENT SYSTEM USING AN EXTRAPOLATED REFERENCE MEASUREMENT

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

This invention relates to a system and method for suppressing noise due to magnetic fields emanating from outside of an area in which biomagnetic fields are being measured.

Magnetic fields from biological sources such as the brain or heart are about 7 to 8 orders of magnitude smaller than the background geomagnetic field. Measurement of such small magnetic fields is possible using a Superconducting Quantum Interference Device (SQUID) and associated electronics; however, the smaller biological signals are usually swamped by the background terrestrial magnetic noise unless some attention is paid to suppressing this noise. There are two methods for doing this. The first method is to shield the desired source and sensor from the interference field using closed chambers of highly conducting and/or permeable materials which either exclude the magnetic interference or "channel" it around the measurement region. Good results are obtained by this method and commercial biomagnetometry systems employ this technique. However, the construction of such shielded chambers is costly, both in terms of material and real estate.

The second method is to suppress the interference fields by constructing a sensor which is much less sensitive to the interfering magnetic fields than it is to the desired magnetic fields. Such sensors are called gradiometers, since they are designed to be sensitive to some higher order gradient (or spatial derivative) of the magnetic field. This scheme takes advantage of the fact that the sources of magnetic interference are much further from the sensors than the biomagnetic sources, and, consequently, their magnetic gradients are smaller (at least as measured by the "finite difference" arrangement of the gradiometer coils). It can be shown that if dipole-like sources of interference are more than 150 ft. away, then a second-order gradiometer will provide as much attenuation of that interference as a clinical quality magnetically shielded room, but at a mere fraction of the cost.

Unfortunately, one can not build a perfect gradiometer, since they are constructed using a particular mechanical arrangement of wound coils of wire. Alignment is critical to obtaining ideal gradiometer performance. For example, a second-order gradiometer "as built" will probably respond to first and zeroth order magnetic fields as well; this is referred to as the "common mode response". Superconducting trim tabs are mechanically positioned around the gradiometer in order to minimize the common mode response, but these adjustments are tedious and prone to change with time. Another problem with mechanical trim adjustment is that it rapidly gets out of hand when there are a large number (>20) or gradiometers, such as would be found in the next generation biomagnetometers.

There is therefore a need to improve upon the conventional gradiometer to achieve higher order gradiometer responses for even better suppression of distant magnetic interference without the attendant difficulties of balancing and trimming.

SUMMARY OF THE INVENTION

Accordingly, it is an object of the present invention to provide a system and method of measuring biological signals without interference from surrounding sources. A further object of the present invention is to provide such a system and method which is effective in real-time, to respond to time-varying magnetic interference fields.

A still further object is to provide such a system which utilizes relatively simple components which are easy to build.

The above and other objects of the present invention are accomplished by providing a system for biomagnetic measurement which has a first order sensor gradiometer, a reference system positioned near the gradiometer and a means for cancelling signals from the gradiometer and reference system to produce a noise reduced signal. The noise field at the sensor location is estimated using three "equivalent" dipoles which are determined from the reference system measurements. A virtual gradiometer response is calculated by subtracting the noise flux difference at the gradiometer from the actual gradiometer response. This virtual gradiometer response is the desired noise reduced response to the biomagnetic field.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description taken in conjunction with the drawings, in which:

DETAILED DESCRIPTION

Figure 1:
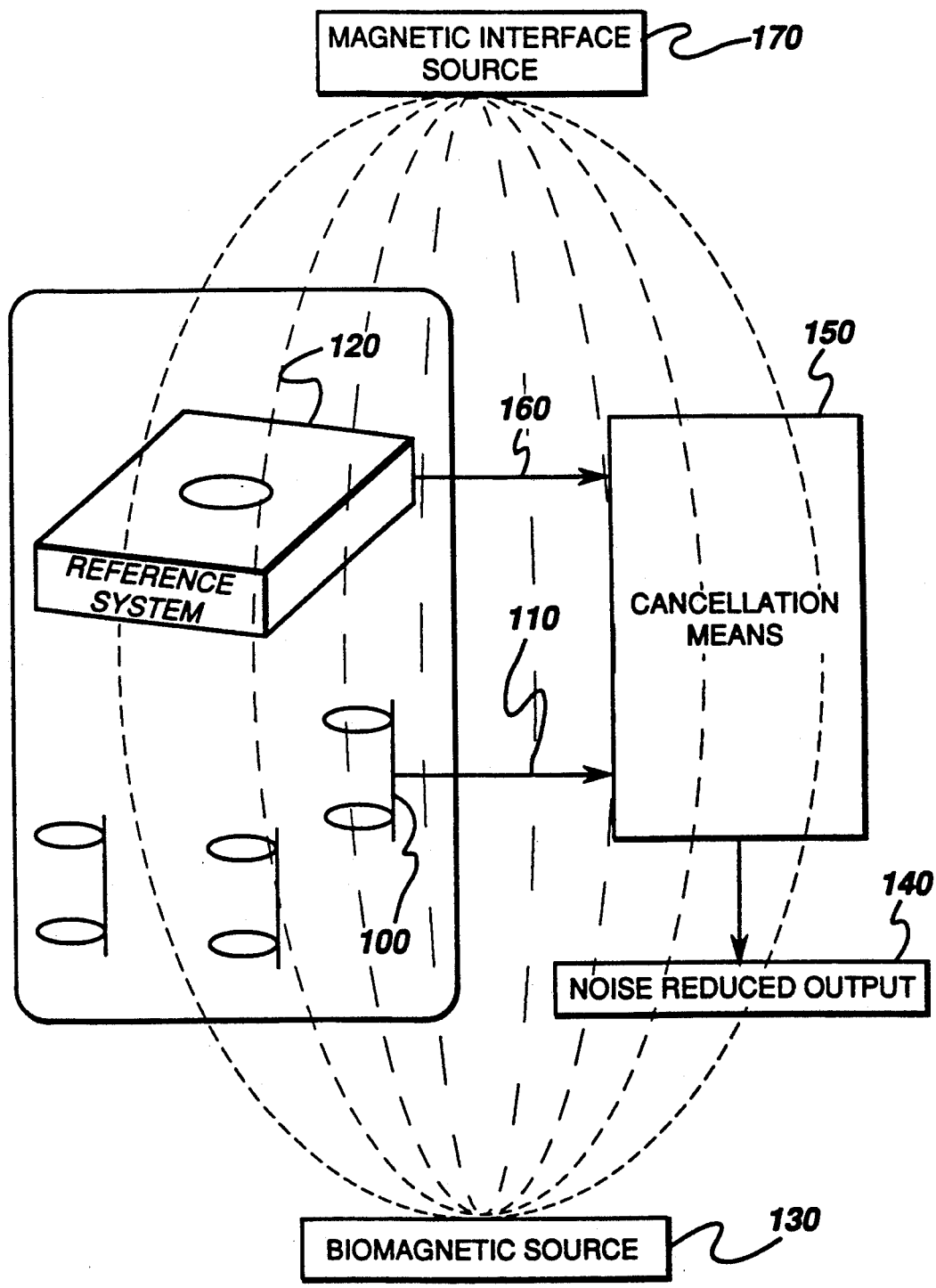
FIG. 1 is a schematic diagram of a biomagnetic measurement system in accordance with the present invention.

Turning now to FIG. 1, there is shown a schematic diagram of the present invention. The primary sensing elements 100 are first order gradiometers whose baseline d (distance between the coils) is chosen to be somewhat larger than the distance between the sensing coil closest to the biomagnetic source 130 and the source itself. Since the magnetic field from the biomagnetic source 130 is proportional to $r^{-2}$, this ensures that the response of the gradiometers to that source will be more like that of a magnetometer than a gradiometer. For example, if the baseline of the gradiometer is 5 cm. and the distance to the source is 2 cm., the flux intercepted by the far coil will be approximately $(2/\eta)^2$ or less than 10% of that intercepted by the near coil. Assuming that sources of magnetic interference are located at distances which are large compared to the gradiometer baseline, the gradiometer gives a response which is approximately the first gradient of the interference field multiplied by the gradiometer baseline $$\text{gradiometer output} \approx \frac{\partial B_\eta}{\partial \eta} dNA \quad (1)$$

where N is the number of turns per coil and A is the coil area. Most interference sources can be represented by magnetic dipoles whose field strength is proportional to $r^{-3}$ and thus has a gradient which is proportional to $r^{-4}$, with higher order gradients falling off in magnitude more rapidly.

Located above the sensor gradiometers 100 and thus even further from the biomagnetic source, is the reference system 120. The reference system provides a measure of the magnetic "noise" field and its first order gradients at a point in space. There are three vector components of the magnetic field, so three orthogonal magnetometers are needed. There are nine components of the gradient tensor, but because at the measurement point the magnetic field is solenoidal ($\nabla \cdot B = 0$) and conservative ($\nabla \times \overline{B} = 0$), only five gradient components need be measured. Thus, the reference system 120 contains three magnetometers and five first order gradiometers.

Reference system 120 provides the data needed to develop a model of the noise sources. Specifically, the model consists of three dipoles in space: a z-directed one in the x-y plane, a y-directed one in the z-x plane, and an x-directed one in the y-z plane. Since these dipoles are only the "best fit" to a measured magnetic field and do not represent any physical dipoles, they will be referred to herein as "equivalent" dipoles.

The dipole magnitude, M, and location, (x, y, z), parameters can be determined from the reference system measurements as follows:

for the z dipole, $$x = \frac{-3B_z B'_{zx}}{B'^2_{zx} + B'^2_{zy}} \quad y = \frac{-3B_z B'_{zy}}{B'^2_{zx} + B'^2_{zy}} \quad M_z = \frac{B_z}{\mu_0}(x^2 + y^2)^{\frac{1}{2}} \quad (2)$$

where, $$B_{\alpha\beta} = \frac{\partial B_\alpha}{\partial \beta}, \; B'_{zx} = \left(\frac{|B_z|}{|B_z| + |B_x|}\right) B_{zx},$$

$$B'_{zy} = \left(\frac{|B_z|}{|B_z| + |B_y|}\right) B_{zy}$$

for the y dipole, $$z = \frac{-3B_y B'_{yz}}{B'^2_{yz} + B'^2_{yx}} \quad x = \frac{-3B_y B'_{yx}}{B'^2_{yz} + B'^2_{yx}} \quad M_y = \frac{B_y}{\mu_0}(z^2 + x^2)^{\frac{1}{2}} \quad (3)$$

where $$B_{\alpha\beta} = \frac{\partial B_\alpha}{\partial \beta}, \; B'_{yz} = B'_{zy}, \; B'_{yx} = \left(\frac{|B_y|}{|B_y| + |B_x|}\right) B_{yx}$$

and for the x dipole, $$y = \frac{-3B_x B'_{xy}}{B'^2_{xy} + B'^2_{xz}} \quad z = \frac{-3B_x B'_{xz}}{B'^2_{xy} + B'^2_{xz}} \quad M_x = \frac{B_x}{\mu_0}(y^2 + z^2)^{\frac{1}{2}} \quad (4)$$

where, $$B_{\alpha\beta} = \frac{\partial B_\alpha}{\partial B}, \; B'_{xy} = B'_{yx}, \; B'_{xz} = B'_{zx}$$

$B_{Xy}$, $B_{Xx}$, and $B_{Yx}$ are not independent so some additional constraints were needed such that the dipole parameters were consistently determined. The set of constraints used were obtained following a heuristic algorithm. The z-directed dipole in the x-y plane is determined by and contributes to the field gradients $$\frac{\partial B_z}{\partial x} \text{ and } \frac{\partial B_z}{\partial y};$$

however, the curl-free nature of $\overline{B}$ means that the x-directed dipole in the y-z plane must also determine $$\frac{\partial B_z}{\partial x} = \frac{\partial B_x}{\partial z}$$

(and vice-versa). A similar statement can be made about $$\frac{\partial B_z}{\partial y}$$

and the y-directed dipole in the z-x plane. In general one can say that each of the curl derivatives has a contribution from some two of the three equivalent dipoles, and there is no unique way of separating them. The contributions of the curl derivatives to the equations which determine the equivalent dipole location are weighted by the magnitude of the magnetic field produced by the affected dipoles. For example, in the case of the z-directed dipole in the x-y plane, the quantity $B_{Xx}$ was replaced by $$B'_{zx} = \left(\frac{|B_z|}{|B_z| + |B_x|}\right) B_{zx}$$

in the dipole determination equations (2)-(4). Similar replacements were made for the rest of the curl derivatives.

Once these three equivalent dipoles have been determined using the equations (2)-(4), the noise field at the primary sensing gradiometers can be estimated.

Given the magnitude and location of the equivalent noise dipoles, the magnetic dipole equation can be used to calculate the magnetic field at the sensing gradiometer coils as follows:

$$\overline{B}(r_p) = \frac{\overline{M} \times (\overline{r}_p - \overline{r}_q)}{4\pi |r_p - r_q|^4} \quad (5)$$

where $\overline{r}_p$ and $\overline{r}_q$ are the position vectors to the sensing coil and the equivalent dipole, respectively. Using the size and orientation of the sensing coils, it is known how to calculate the magnetic flux of the gradiometer coil.

The divergence derivative outputs of the reference system, $$\frac{\partial B_x}{\partial x}, \frac{\partial B_y}{\partial y}, \text{ and } \frac{\partial B_z}{\partial z}$$

are used as a simple linear correction to the extrapolated fields provided by the equivalent noise dipoles. Three corrections are generated according to $$B_{xcorr} = \frac{\partial B_x}{\partial x}(x_p - x_q)$$

$$B_{ycorr} = \frac{\partial B_y}{\partial y}(y_p - y_q)$$

$$B_{zcorr} = \frac{\partial B_z}{\partial z}(z_p - z_q)$$

The corrections are added to the extrapolated fields of the dipoles.

Figure 2:
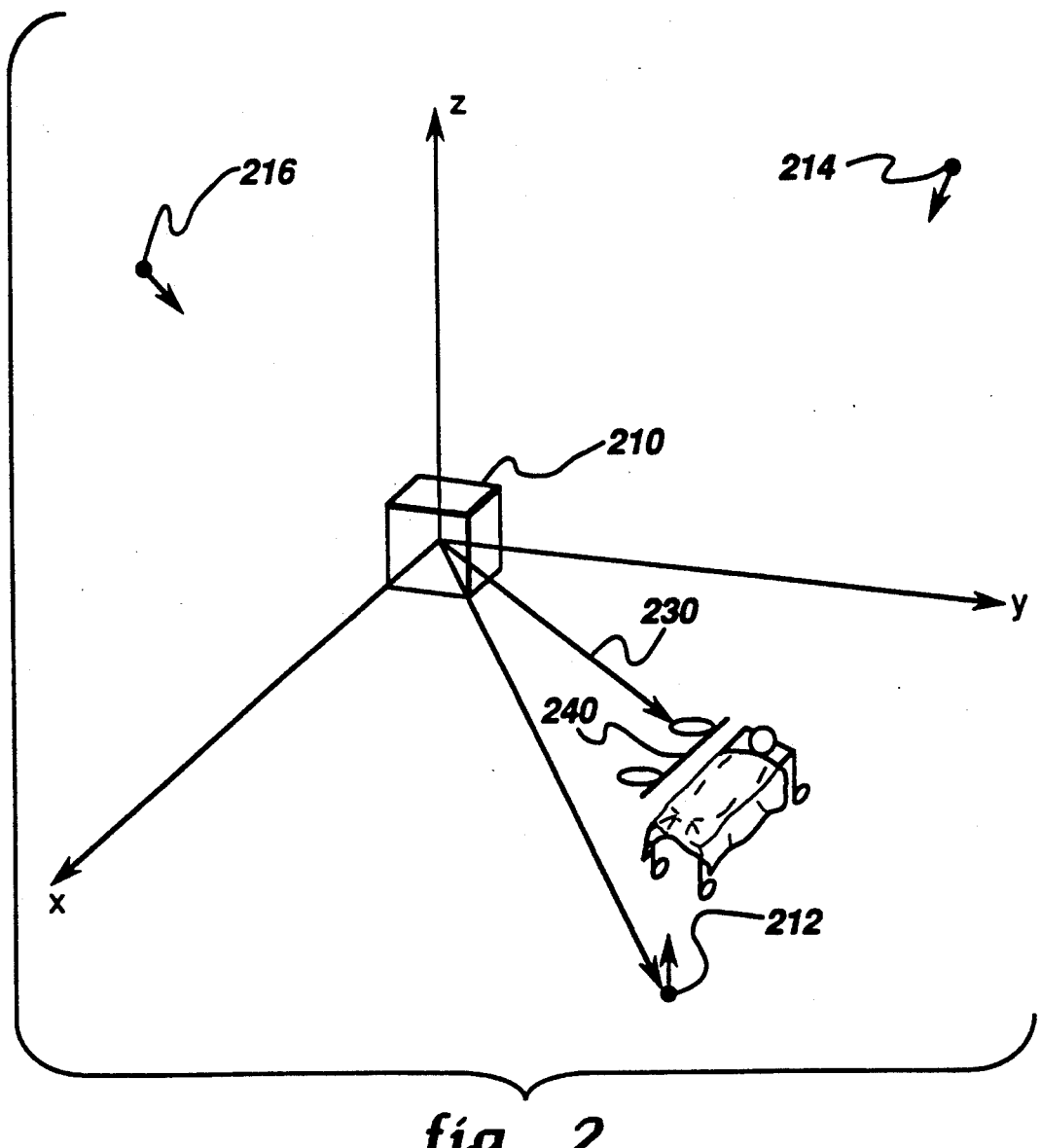
FIG. 2 is a schematic diagram of the elements of the present invention in three-space with equivalent dipoles "fitted" by the present invention.

Referring now to FIG. 2, the reference system 210 is located at an origin point (0, 0, 0) which defines x, y, and z. Based on the measurements obtained by the eight components of the reference system 210, three "equivalent" dipoles 212, 214, and 216 are computed. The three dipoles are an approximation to the interference sources causing the interference field. Vector 220 is $\bar{r}_q$ in equation (5) and it is the position vector from the reference system 210 to one of the equivalent dipoles 212. Also shown in FIG. 2 is vector 230 which is $\bar{r}_p$ in equation (5). Vector 230 is the position vector from the reference system 210 to one of the coils of gradiometer 240. Since equation (5) gives a magnetic field at one coil due to one dipole, the equation must be used six times for each gradiometer present to account for the effect of the three equivalent dipoles on both gradiometer coils.

The flux through one of the coils of gradiometer 240 is the total of the noise flux and the desired signal flux (from the biomagnetic source). As explained above, the noise flux can be calculated from equation (5) and the knowledge of the coil area and orientation. If this noise flux is subtracted from the total measured flux, the result is the flux due to only the desired biomagnetic field. Since a gradiometer measures the difference in flux between its two coils, the virtual gradiometer output of gradiometer 240 (what the gradiometer response would be to only the biomagnetic source) is computed as follows:

Virtual gradiometer output=physical (6) gradiometer output=[noise flux in coil 2−noise flux in coil 1].

Referring again to FIG. 1, the physical gradiometer signal 210 (physical gradiometer output in equation (6)) is fed to cancellation means 150. Cancellation means 150 can be simple electronic circuitry. Signal 160 is that portion of equation (6) in brackets which is subtracted from signal 110 to obtain the noise reduced signal 140 (the "virtual" gradiometer output in equation (6)).

While specific embodiments of the invention have been illustrated and described herein, it is realized that modifications and changes will occur to those skilled in the art. It is therefore to be understood that the appended claims are intended to cover all such modifications and changes as fall within the true spirit and scope of the invention.

What is claimed is:

1. A method for noiseless measurement of a biomagnetic field comprising the steps of:

positioning, near a biomagnetic source, at least one first order sensor gradiometer for generating a first signal representative of a magnetic field gradient;

positioning, near said gradiometer, a reference system for measuring a magnetic interference field and its first order gradients;

representing said magnetic interference field as a magnetic dipole in each of the planes x-y, x-z, and y-z in relation to said reference system;

computing an estimate of the noise due to said magnetic interference field at the coils of said gradiometer using the magnetic dipole equation $$\bar{B}(\bar{r}_p) = \frac{\bar{M} \times (\bar{r}_p - \bar{r}_q)}{4\pi |\bar{r}_p - \bar{r}_q|^4}$$

where $\bar{r}_p$ and $\bar{r}_q$ are the position vectors from said reference system to the coils of said gradiometer and said magnetic dipoles respectively;

performing a linear correction to said estimate using the first order gradients $$\frac{\partial B_x}{\partial x}, \frac{\partial B_y}{\partial y}, \frac{\partial B_z}{\partial z}$$

said reference system;

calculating the magnetic noise flux at the coils of said gradiometer and generating a second signal representative of the noise flux gradient for said gradiometer; and differencing said first and second signals to obtain a signal representative of a noiseless gradiometer output.

2. The method of claim 1 wherein said reference system comprises:

three magnetometers and five first order gradiometers.

3. The method of claim 2 wherein said representing step comprises:

calculating a z-directed dipole in the x-y plane according to the equations $$x = \frac{-3B_z B'_{zx}}{B'^2_{zx} + B'^2_{zy}} \quad y = \frac{-3B_z B'_{zy}}{B'^2_{zx} + B'^2_{zy}} \quad M_z = \frac{B_z}{\mu_0}(x^2 + y^2)^{\frac{5}{2}}$$

where, $$B_{\alpha\beta} = \frac{\partial B_\alpha}{\partial \beta}, \quad B'_{zx} = \left(\frac{|B_z|}{|B_z| + |B_x|}\right) B_{zx},$$

$$B'_{zy} = \left(\frac{|B_z|}{|B_z| + |B_y|}\right) B_{zy}$$

calculating a y-directed dipole in the x-z plane according to the equations $$z = \frac{-3B_y B'_{yz}}{B'^2_{yz} + B'^2_{yx}} \quad x = \frac{-3B_y B'_{yx}}{B'^2_{yz} + B'^2_{yx}} \quad M_y = \frac{B_y}{\mu_0}(z^2 + x^2)^{\frac{5}{2}}$$

where, $$B_{\alpha\beta} = \frac{\partial B_\alpha}{\partial \beta}, \; B'_{yz} = B'_{zy}, \; B'_{yx} = \left(\frac{|B_y|}{|B_y|+|B_x|}\right) B_{yx}$$

according to the following equations $$y = \frac{-3B_x B'_{xy}}{B'^2_{xy}+B'^2_{xz}} \quad z = \frac{-3B_x B'_{xz}}{B'^2_{xy}+B'^2_{xz}} \quad M_x = \frac{B_x}{\mu_0}(y^2+z^2)^{\frac{1}{2}}$$

where, $$B_{\alpha\beta} = \frac{\partial B_\alpha}{\partial \beta}, \; B'_{xy} = B'_{yx}, \; B'_{xz} = B'_{zx}.$$

4. The method of claim 3 wherein said step of performing a linear correction performs linear corrections to said noise estimate according to the following equations $$B_{xcorr} = \frac{\partial B_x}{\partial x}(x_p - x_q)$$

$$B_{ycorr} = \frac{\partial B_y}{\partial y}(y_p - y_q)$$

$$B_{zcorr} = \frac{\partial B_z}{\partial z}(z_p - z_q).$$

* * * * *